United States Patent
Nunn

(10) Patent No.: US 7,911,057 B2
(45) Date of Patent: Mar. 22, 2011

(54) BUMPLESS FLIP-CHIP ASSEMBLY WITH A COMPLAINT INTERPOSER CONTRACTOR

(75) Inventor: Wayne Nunn, Hidden Valley Lake, CA (US)

(73) Assignee: NXP B.V., Eindhoven (NL)

( * ) Notice: Subject to any disclaimer, the term of this patent is extended or adjusted under 35 U.S.C. 154(b) by 301 days.

(21) Appl. No.: 12/095,155

(22) PCT Filed: Nov. 29, 2006

(86) PCT No.: PCT/IB2006/054517
§ 371 (c)(1),
(2), (4) Date: Aug. 22, 2008

(87) PCT Pub. No.: WO2007/063510
PCT Pub. Date: Jun. 7, 2007

(65) Prior Publication Data
US 2008/0315389 A1    Dec. 25, 2008

Related U.S. Application Data

(60) Provisional application No. 60/740,872, filed on Nov. 29, 2005.

(51) Int. Cl.
*H01L 23/48* (2006.01)
(52) U.S. Cl. . 257/746; 257/690; 257/698; 257/E23.027; 438/610; 438/119
(58) Field of Classification Search .................. 257/746, 257/690, 698, E23.027; 438/610, 119
See application file for complete search history.

(56) References Cited

U.S. PATENT DOCUMENTS

| | | | |
|---|---|---|---|
| 4,820,376 A | 4/1989 | Lambert et al. | |
| 5,345,365 A | 9/1994 | Herndon et al. | |
| 2002/0105092 A1* | 8/2002 | Coyle | 257/778 |
| 2003/0102154 A1 | 6/2003 | Haba | |
| 2003/0186572 A1* | 10/2003 | Hougham et al. | 439/91 |

FOREIGN PATENT DOCUMENTS

GB    804171 A    11/1958

OTHER PUBLICATIONS

JEDEC Design Standard "Design Requirements for Outlines of Solid State and Related Products" JEDEC Publication No. 95, Design Guide 4.2, pp. 1-22.

* cited by examiner

*Primary Examiner* — Tu-Tu V Ho
(74) *Attorney, Agent, or Firm* — Peter Zawilski

(57) ABSTRACT

Consistent with an example embodiment, an integrated circuit device (IC) is assembled on a package substrate and encapsulated in a molding compound. There is a semiconductor die having a circuit pattern with contact pads. A package substrate having bump pad landings corresponding to the contact pads of the circuit pattern, has an interposer layer sandwiched between them. The interposer layer includes randomly distributed mutually isolated conductive columns of spherical particles embedded in an elastomeric material, wherein the interposer layer is subjected to a compressive force from pressure exerted upon an underside surface of the semiconductor die. The compressive force deforms the interposer layer causing the conductive columns of spherical particles to electrically connect the contact pads of the circuit pattern with the corresponding bump pad landings of the package substrate. The compressive force may be obtained from forces generated by thermal expansion properties of the molding compound and package substrate, metal clips or combinations, thereof.

9 Claims, 6 Drawing Sheets

LOW DEFORMATION

MEDIUM DEFORMATION

HIGH DEFORMATION

US 7,911,057 B2

BUMPLESS FLIP-CHIP ASSEMBLY WITH A COMPLAINT INTERPOSER CONTRACTOR

The invention relates to integrated circuit (IC) packaging. More particularly this invention relates to assembling an IC device in a flip-chip configuration that eliminates the bumping process.

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured with various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

After undergoing the process of fabrication, the silicon wafer has a predetermined number of devices. These devices are tested. Good devices are collected and packaged.

The packaging of complex IC devices is increasingly playing a role in its ultimate performance. Flip-chip assembly provides for the reduction of package profile by eliminating the use of bond wires and their added height. Furthermore, the flip-chip provides for a solid high-performance electrical connection. However, flip-chip bumping process adds complexity to the packaging, in that bump pads must be attached to the IC device's bond pad landings so that the IC device may be attached to the package substrate.

There is a need to reduce complexity in the packaging of flip-chip IC device and still maintain a high performance electrical connection between the silicon die and the substrate interconnect.

The present invention has been found useful in implementing a high performance electrical connection between the bond pads of the silicon die and the connection pads on a substrate. By eliminating the bumping process, a multitude of assembly, reliability, manufacturing infrastructure and greatly reduced packaging costs are may be realized. A high performance, commercially available interposer fabric that is sandwiched between the IC die and package substrate, is subjected to a compressive force. Strings of balls (that are mutually isolated) arrayed throughout the interposer fabric, as they are compressed, form electrical connections between the bond pads of the IC die and the package substrate. The interposer fabric acts as a redistribution layer in re-routing signal traces from bond pads of a narrow pitch to substrate connection pads having a wider pitch.

In an example embodiment, there is an integrated circuit device (IC) assembled on a package substrate and encapsulated in a molding compound. The IC device comprises a semiconductor die having topside surface and an underside surface; the topside surface has a circuit pattern and the circuit pattern including contact pads in a predetermined arrangement. A package substrate has a length and width; the package substrate has bump pad landings. The bump pad landings are in an arrangement corresponding to the predetermined arrangement of the contact pads of the circuit pattern; the bump pad landings have connection traces coupling the pad landings to external contact regions in the package substrate. An interposer layer is sandwiched between the semiconductor die and the package substrate; the interposer layer includes randomly distributed mutually isolated conductive columns of spherical particles embedded in an elastomeric material. The interposer layer is subjected to a compressive force from pressure exerted upon the underside surface of the semiconductor die and the compressive force deforms the interposer layer causing the conductive columns of spherical particles to electrically connect the contact pads of the circuit pattern with the corresponding bump pad landings of the package substrate.

In another embodiment, an integrated circuit device (IC) is assembled on a package substrate. The IC device comprises a semiconductor die having topside surface and an underside surface, the topside surface having a circuit pattern, the circuit pattern including contact pads in a predetermined arrangement. A package substrate has length and width, the package substrate has bump pad landings; the pad landings are in an arrangement corresponding to the predetermined arrangement of the contact pads of the circuit pattern; the bump pad landings have connection traces coupling the pad landings to external contact regions in the package substrate. An interposer layer is sandwiched between the semiconductor die and the package substrate, the interposer layer including randomly distributed mutually isolated conductive columns of spherical particles embedded in an elastomeric material. The interposer layer is subjected to a compressive force from metal clip exerting pressure upon the underside surface of the semiconductor die, the compressive force deforming the interposer layer causing the conductive columns of spherical particles to electrically connect the contact pads of the circuit pattern with the corresponding bump pad landings of the package substrate. A passivating envelope of molding compound encapsulates the semiconductor die and interposer fabric.

In yet another embodiment, there is a method for packaging an IC device having a circuit pattern including I/O contact pads in a flip-chip orientation on a package substrate, the package substrate having pad landings corresponding to the I/O contact pads of the circuit pattern. The method comprises selecting the package substrate suitable for an I/O pad layout of the IC device. An interposer fabric is applied on the package substrate, the interposer fabric having randomly distributed mutually isolated conductive columns of spherical particles embedded in an elastomeric material. The IC device is placed in the flip-chip orientation upon the interposer fabric. A compressive force on the IC device is applied. The compressive force deforms the interposer layer causing the conductive columns of spherical particles to electrically connect the contact pads of the circuit pattern with the corresponding bump pad landings of the package substrate. The compressive force is maintained on the IC device and the IC device is encapsulated in a passivating envelope. The above summary of the present invention is not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which:

FIGS. 1B-1D is a side view of the interposer fabric deformed at several force levels electrically coupling the IC device contact pads to corresponding pad landings on a circuit board substrate, wherein, FIG. 1B is a side view of the interposer fabric of FIG. 1C deformed at a low force;

FIG. 1C is a side view of the interposer fabric deformed at an intermediate force;

FIG. 1D is a side view of the interposer fabric deformed at a large force;

Figure 1A:
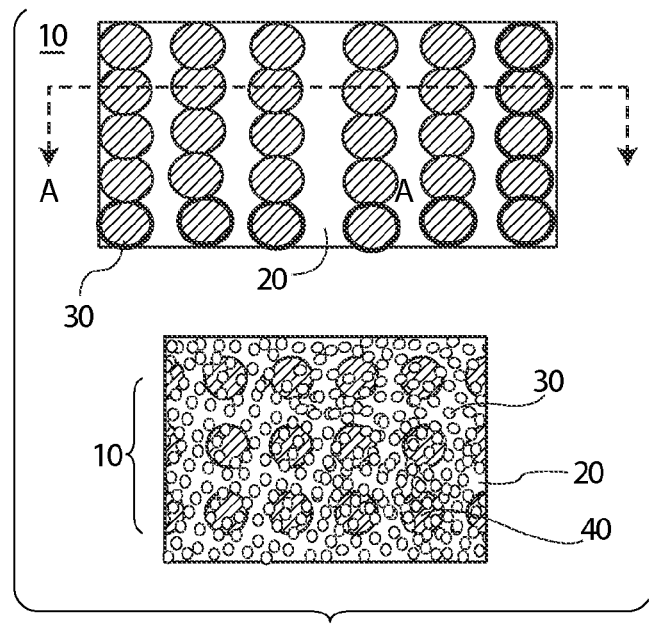
FIG. 1A is a side view and top view of an interposer fabric.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

The present invention has been found to be useful in providing a contact interface by forming a redistribution layer of a flexible interposer fabric in re-routing signal traces in the input/output pads on the IC device to a bump pattern on the package substrate. The connection between the input/output pads of the IC device to a corresponding bump pattern on the package substrate is achieved as the interposer, having arrays of randomly distributed mutually isolated conductive columns of spherical particles (e.g., conductive balls), is sandwiched between the IC device and package substrate and subjected to compressive force. More pressure is exerted at the input/out pads and bump patter than in other areas of the chip, the conductive surfaces at a higher topography than the surround non-conductive dielectric regions. No electrical connection is made in areas without mutually opposite conductive surfaces. The compressive force may be attained in a number of ways during package assembly. Such a compressive force, may be attained, but not necessarily limited to, a high thermal coefficient of expansion (TCE) molding compound, a mechanical clip, or a mechanical pre-stress clip.

Figure 1B:
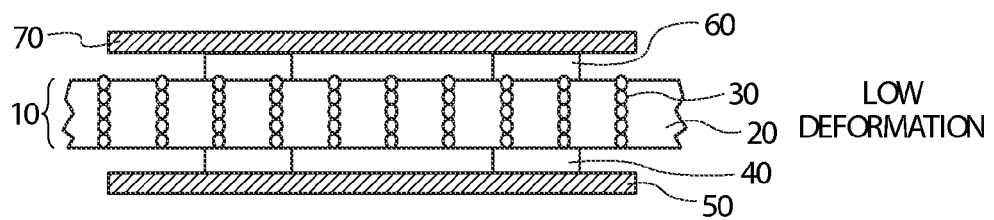
Figure 1C:
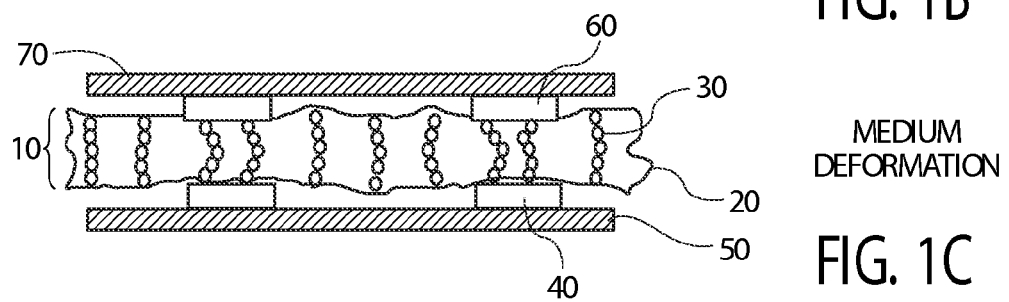
Figure 1D:
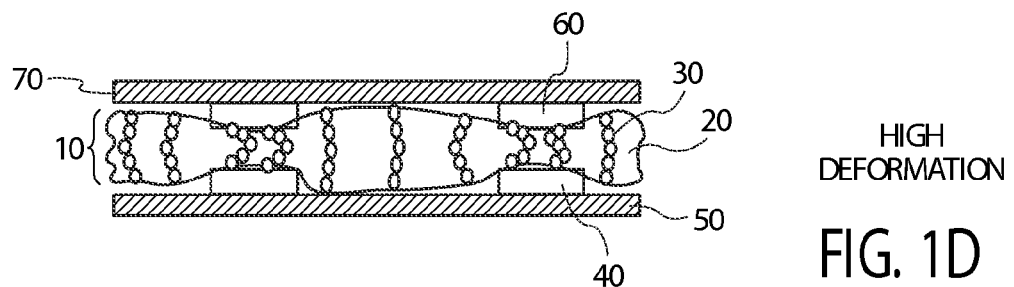

In an example embodiment, the interposer fabric may be used with standard ball grid array (BGA) packaging form factors and their associated assembly processes. However, the use of interposer fabric is not necessarily limited to a particular package substrate type. The interposer fabric may find use in flip-chip mounting on printed circuit board (PCB) as in the case of system-in-chip (SIP) applications. Refer to FIG. 1A. A compliant elastomeric interposer fabric 10 is depicted in side view and top view. Randomly distributed conductive columns of conductive spherical particles 20 are distributed about a flexible membrane 30. The gold contact pads 40 may be seen through the flexible membrane 30. Refer to FIGS. 1B-1D. The interposer fabric 10 is sandwiched between a package substrate 50 and silicon die 70. Contact pads 60 on the silicon die 70 and bump pads 40 on package substrate 50 are connected together by the arrays of conductive balls 20 as a compressive force is applied to the silicon die 70 and package substrate 50. FIGS. 1B -1D show the deformation of the interposer fabric 10 under increasing pressure. FIG. 1B shows deformation at less than 1%, FIG. 1C shows intermediate deformation of about 10% and FIG. 1D shows a large deformation of about 35%. At a given displacement between the silicon die 70 and package substrate 50, the contact pads 60 and bump pads 40 have a greater compressive force exerted thereon, owing to the features standing out in relief above the silicon die 70 or package substrate 50. The randomly distributed conductive columns of conductive balls 20 make no connection on insulated areas of the silicon die 70 and package substrate 50. Package substrate 50 may be modified to include a solder mask (not illustrated) to provide additional insulation between bump pads 40. The primary purpose of solder mask at a BGA site is to isolate solder wetting to a specific area, the BGA pad for attachment of the solder balls on the external package. A solder mask is used to isolates the pad from the conductor, or from the circuit leading to contact opening or plated hole. Without the solder mask, molten solder may bleed away onto the connecting circuits, or into the attached contact openings. Solder joint opens and shorts result. For the present invention, the solder mask adds additional isolation so that the interposer fabric may be guided into solder mask holes defined in the bump pads. The use of a solder mask is dependent on the number of bump pads and their distance between one another.

Figure 2:
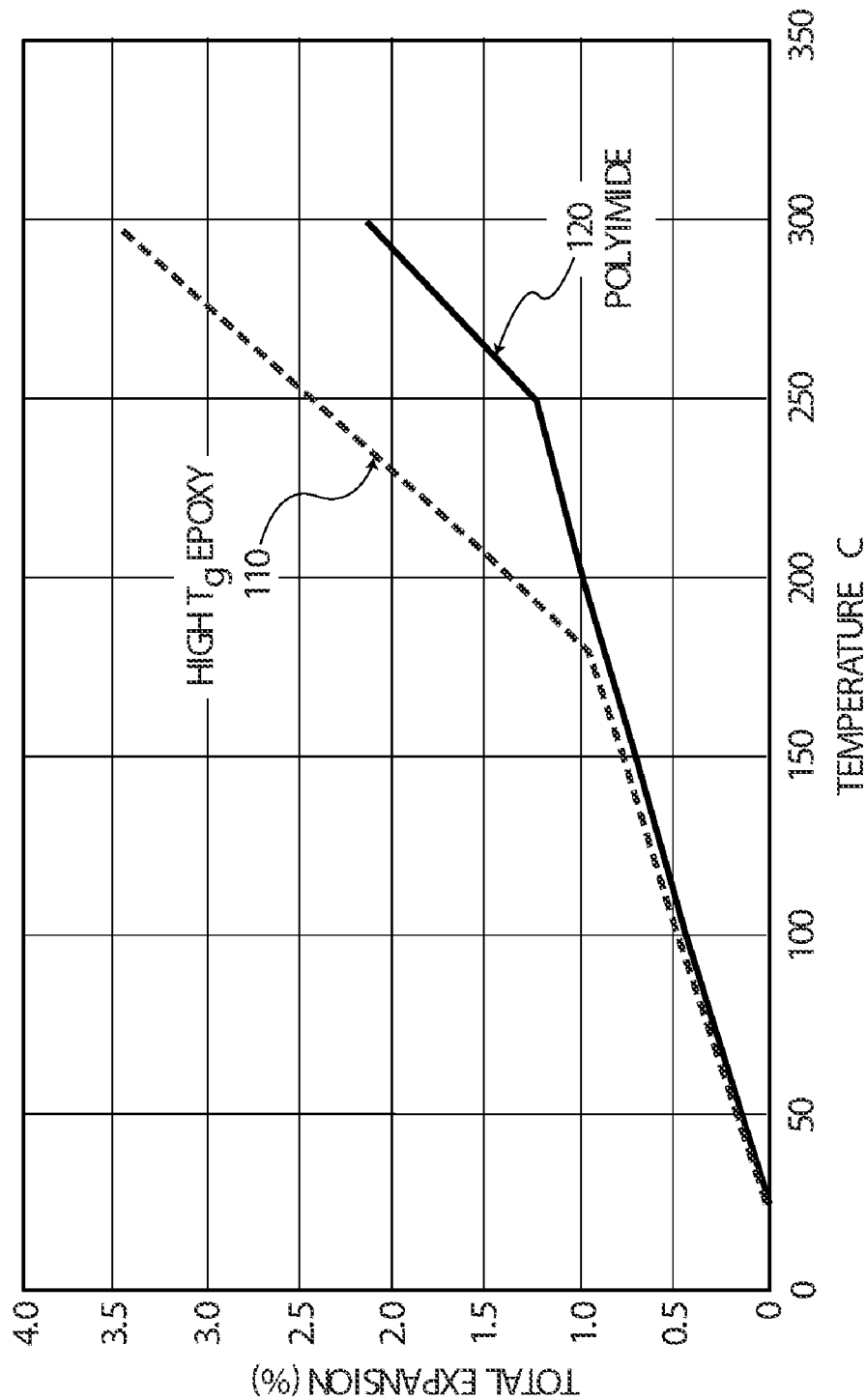
FIG. 2 depicts a plot of Z-direction percentage expansion versus temperature for two example substrate materials.

In an example embodiment, during IC device assembly, the high TCE molding compound may be used to provide a compressive force to the interposer, thereby providing electrical connection between the IC device I/O pads and the bump pads of a flip-chip package. The TCE molding compound is selected to have a very high TCE mismatch between the silicon die and substrate material to provide a force mechanism. The vertical Z-direction of expansion of materials may be observed in FIG. 2. A plot of a high Tg epoxy material 110 shows an expansion of about 1.0% from about 25° C. to 175° C. Such materials would ideally have substantially less horizontal expansion, in the "X" and "Y" directions. There is an additional 2.5% expansion between as the ambient temperature is raised from about 175° C. to 300° C. (a total 3.5% expansion). The glass-transition temperature (Tg) is the temperature at which a material goes from solid to a "rubbery" amorphous state. In contrast, a plot of a polyimide material having a lower Tg shows only a 1.0% expansion from 25° C. to about 200° C. There is an additional 1.25% expansion from 200° C. to about 300° C. (a total 2.25% expansion). Thus, the vertical expansion of material provides sufficient force to the interposer fabric.

For a particular IC device and application environment, the appropriate materials needed to assemble the IC device would have to be determined. Having determined the appropriate materials, the designer would experiment to find the optimum combinations and configurations of TCE compatible materials, interposer fabric to assure long-term reliable electrical contact between IC die contact pads and package substrate bump pads. Such an optimum combination may be derived from a design of experiments (DOE) analysis.

Figure 3:
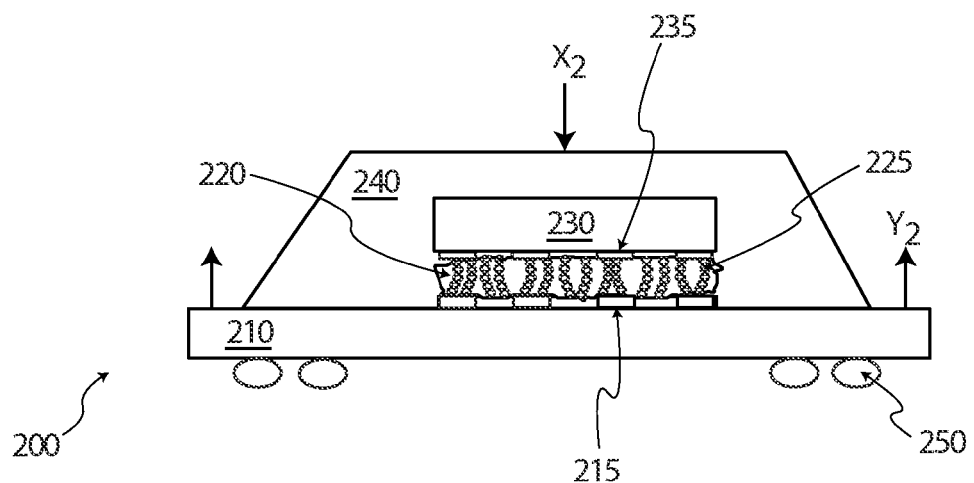
FIG. 3 is a side of an IC device electrically coupled to the package substrate with interposer fabric using the force of a high glass-transition temperature ($T_g$) mold compound, yielding a high CTE mismatch between the fabric and interposer fabric according to an embodiment of the present invention.

Refer to FIG. 3. An IC device assembled in a flip-chip package 200 is depicted in side view. The package substrate 210 has a silicon die 230 placed on top of an interposer fabric 220. One particular interposer fabric is PARIPOSER™, manufactured by Paricon Technologies Corporation, Fall River, Mass. A high $T_g$ molding compound 240 encapsulates the silicon die 230, interposer fabric 220, that part of the package substrate 210 having the bump pads 215. The high-TCE molding compound 240 exerts a downward compressive force X2 upon the silicon die 230, interposer fabric 220, and bump pads 215. The package substrate 210 having a different TCE exerts an upward force Y2 opposite the compressive force X2. The conductive balls 225 in the interposer fabric provide the electrical connection between I/O contact pads 235 on the silicon die 230 and the bump pads 215 on the package substrate 210. Solder balls 250 provide electrical connection from the assembled IC device 200 to the application environment.

In a particular embodiment, the substrate 210 may use thermoset plastic industrial laminates, e.g. NEMA (National Electrical Manufacturers Association) grades G10 or FR4 glass-cloth reinforced glass epoxy. If used, a solder mask material would have a Tg in the range of about 180° C. to about 220° C. Molding compound would have a Tg in the range of about 200° C. to 260° C.

Figure 4:
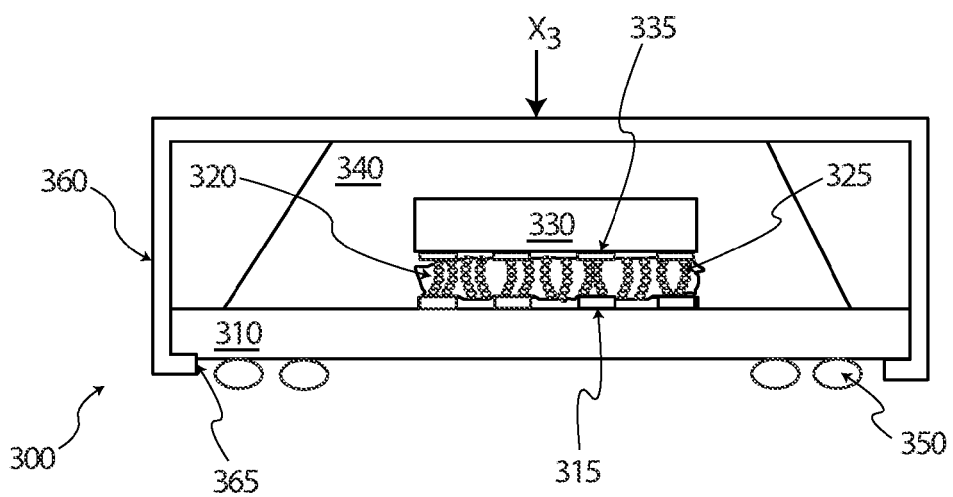
FIG. 4 is a side view of an IC device electrically coupled to the package substrate with an interposer fabric using the force exerted upon the IC device by a metal clip according to an embodiment of the present invention.

In an example embodiment, during IC device assembly, upon a silicon die, interposer fabric and package substrate, an external metal mechanical clip may be placed and clamped upon the package substrate to provide compressive force, thereby providing electrical connection between the IC device I/O contact pads and the bump pads of a flip-chip package. Refer to FIG. 4. An IC device assembled in a flip-chip package 300 is depicted in side view. The package substrate 310 has a silicon die 330 placed on top of an interposer fabric 320. A metal clip 360 clamps the silicon die 330, interposer fabric 320, that part of the package substrate 310 having the bump pads 315. The metal clip 360 exerts a compressive force X3 upon the silicon die 330, interposer fabric 320 and bump pads 215. The conductive balls 325 in the interposer fabric 320 provide the electrical connection between I/O contact pads 335 on the silicon die and the bump pads 315 on the package substrate 330. Solder balls 350 provide electrical connection from the assembled IC device 300 to the application environment. Molding compound 340 encapsulates the silicon die 330. Metal clip 360 will be on the outside of molding compound 340.

Figure 5A:
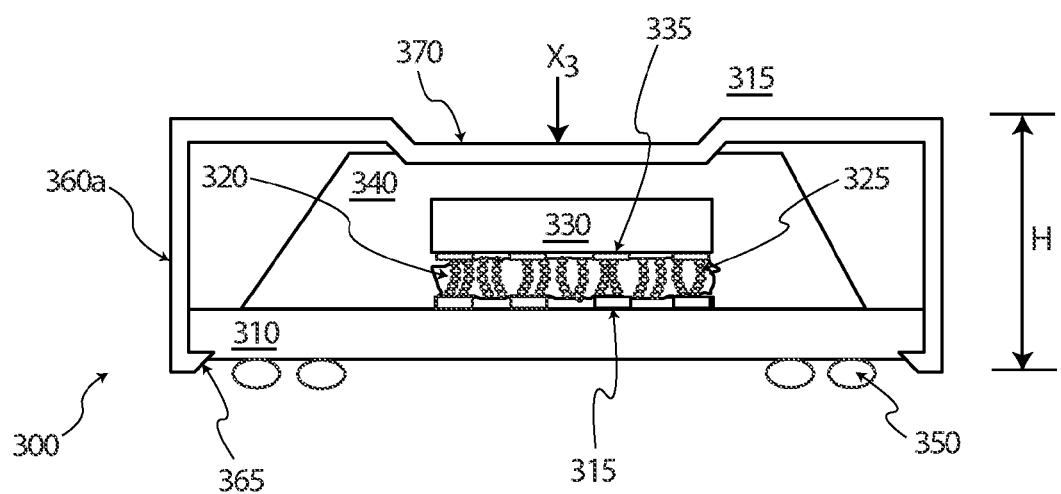
FIG. 5A is a side view of an IC device electrically couple to a package substrate with an interposer fabric using the force exerted upon the IC device by a metal the metal clip of FIG. 4, the metal clip modified to provide additional pre-stress force upon the encapsulated IC device.
Figure 5B:
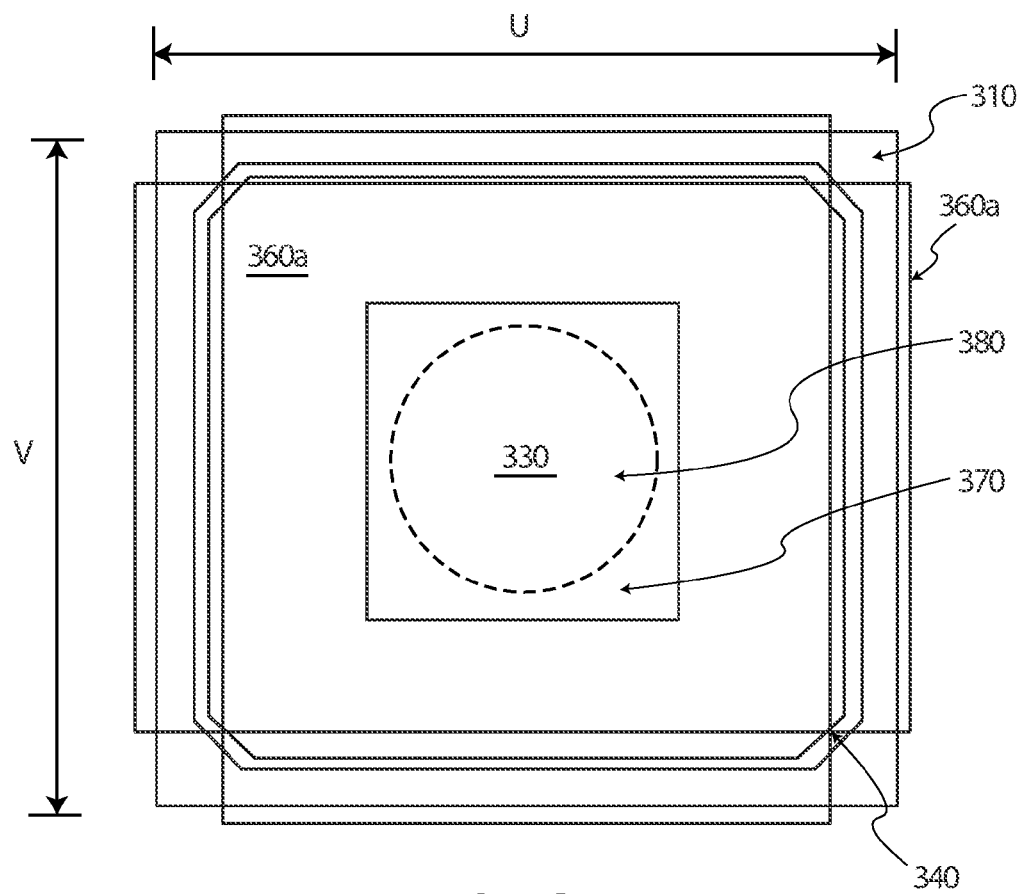
FIG. 5B is a top view of the IC device of FIG. 5A.

Refer to FIGS. 5A-5B. In a modification to the external mechanical clip 360, clip 360a has a detent 370 to pre-stress the encapsulated silicon die 330 as the clip is attached to the package substrate 310. In an example substrate, the package size is about 35 mm×35 mm, the U and V dimensions of FIG. 5B. The height of the package is about 4.73 mm, as the H dimension depicted in FIG. 5A. The metal clip would follow JEDEC silicon package body sizes, e.g., 35 mm, 37.5 mm, 40 mm, etc. Additional information may be found in JEDEC Publication 95 (JEP95) titled, "JEDEC Registered and Standard Outlines for Solid State and Related Products." In another embodiment, there may be an opening 380 defined in this metal clip 360a.

Figure 6A:
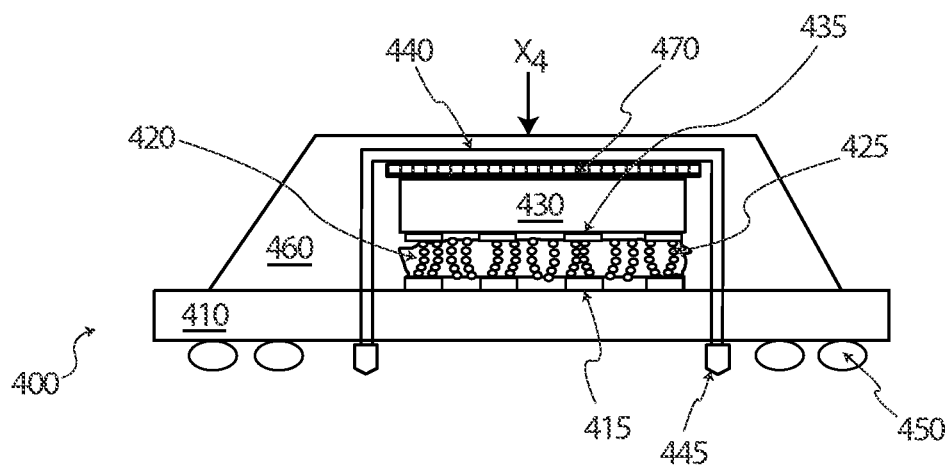
FIG. 6A is a side view of an IC device electrically couple to a package substrate with an interposer fabric using the force exerted upon the IC device by a metal clip/retention head according to an embodiment of the present invention.
Figure 6B:
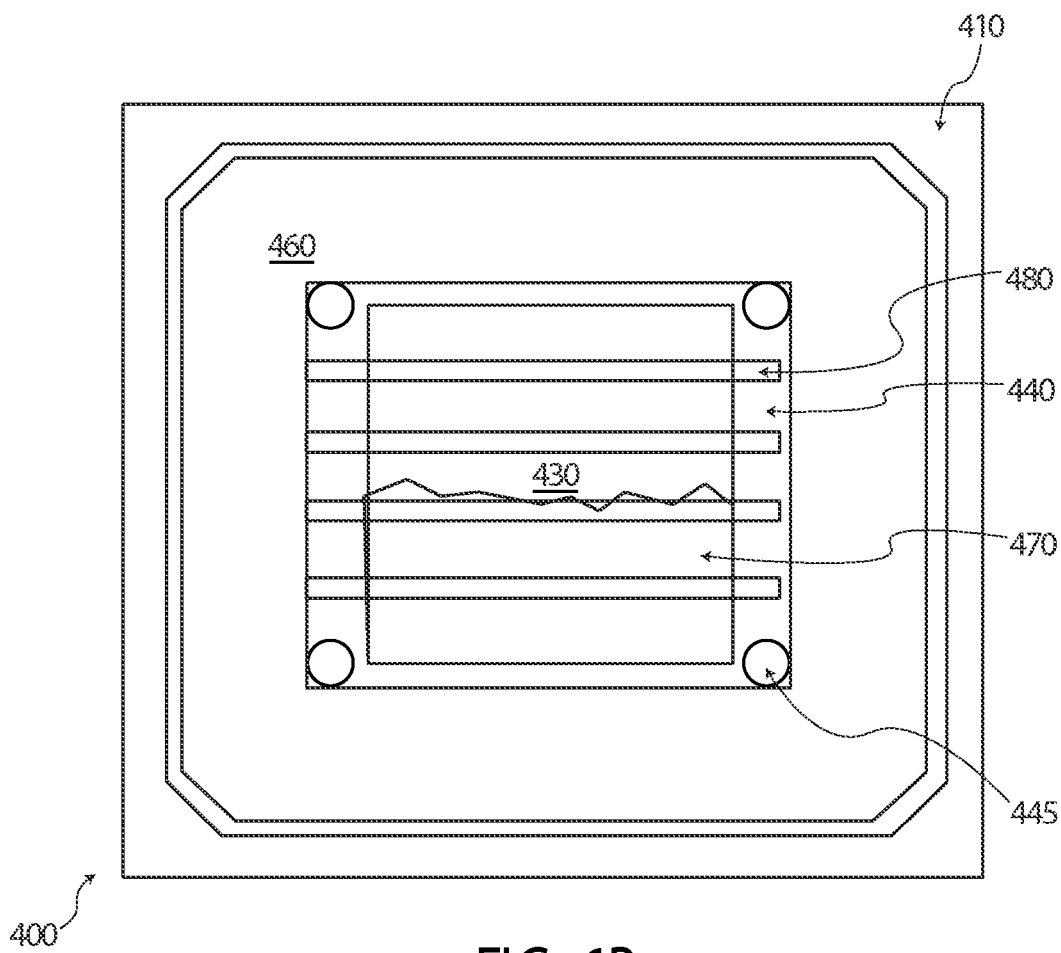
FIG. 6B is top view of the package depicted in FIG. 6A.

In an example embodiment, during IC device assembly, a mechanical pre-stress clip may be placed upon a silicon die, interposer fabric and package substrate. Retention heads anchor the metal clip to the package substrate and provide compressive force to the silicon die, interposer fabric and package substrate, thereby providing electrical connection between the IC device I/O contact pads and the bump pads of a flip-chip package. Refer to FIGS. 6A-6B. An IC device assembled in a flip-chip package 400 is depicted in side view. The package substrate 410 has a silicon die 430 placed on top of an interposer fabric 420. On top of the silicon die 430, a material 470 having a similar TCE to that of the silicon die, is placed. An internal mechanical pre-stress metal clip 440 driven into holes defined in the package substrate 430, clamps the silicon die 430, interposer fabric 420, that part of the package substrate 3410 having the bump pads 415. The metal clip 440 has retention heads 445 to provide mechanical attachment. The metal clip 440 exerts a compressive force X4 upon the silicon die 430, interposer fabric 420 and bump pads 415. The clip would be designed to pre-stress the die before the retention heads 445 are inserted and pressed into and through to the other side of the package. The conductive balls 425 in the interposer fabric 420 provide the electrical connection between I/O contact pads 435 on the silicon die and the bump pads 415 on the package substrate 420. Molding compound 460 encapsulates the silicon die 430, interposer fabric 420, and metal clip 440. Openings 480 such as slits, in the metal clip 440 facilitate the flow of molding compound. Solder balls 450 provide electrical connection from the assembled IC device 400 to the application environment.

In another example embodiment, an additional adhesive layer 470 may be applied to the underside of the silicon die. The adhesive layer 470 is selected to have similar TCE and Tg characteristics of the molding compound 460.

In an example embodiment, the re-usable nature of the compliant elastomeric interposer may be used in under module test conditions to determine whether a given silicon die is functional after test. In an array of package substrates, a given number of silicon die may be placed and pressed on the interposer fabric of each package substrate. Each silicon die may then be electrically tested. Failing devices are culled out. Replacement devices may be substituted for the failing devices. Thus, before encapsulation, all of the devices in the array of package substrates are assured functional.

Figure 7:
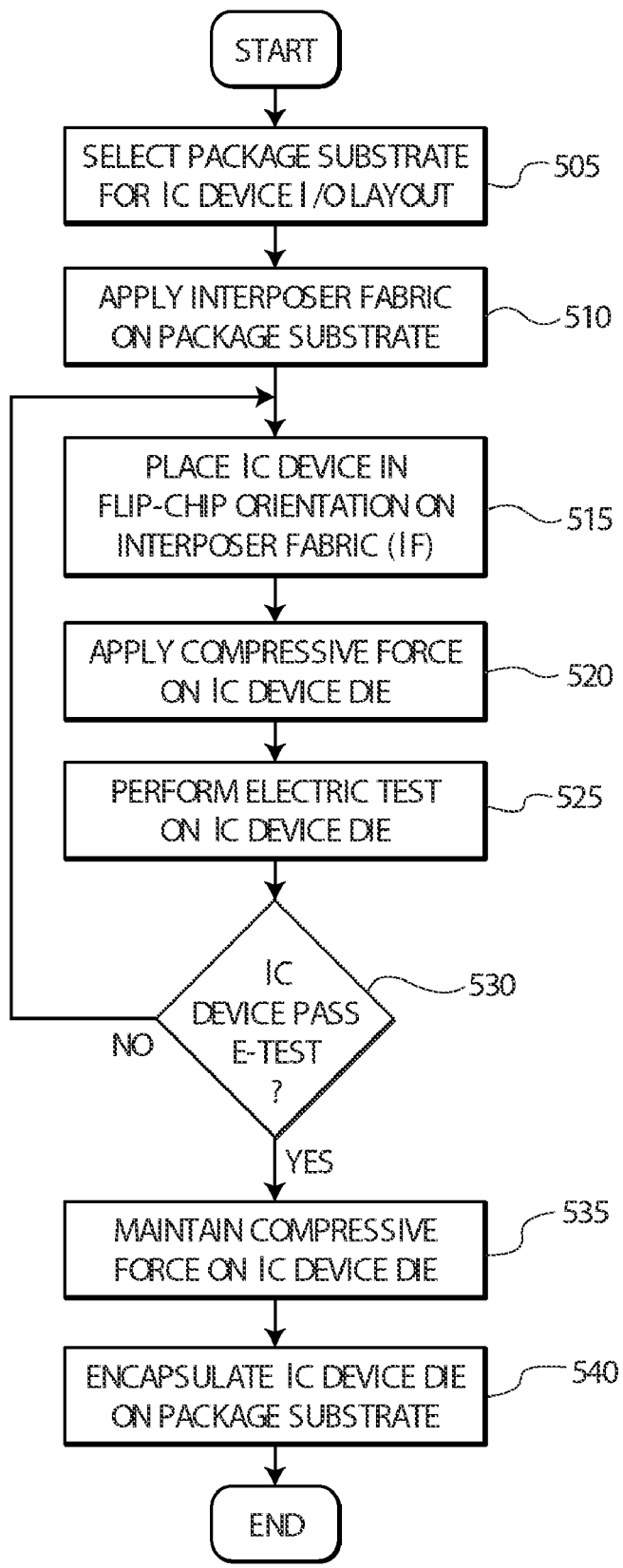
FIG. 7 is a flowchart of a process implementing the present invention.

Refer to FIG. 7. The procedure 500 may be used to assemble IC devices and test them before they are encapsulated. A compatible package substrate having a number of bump pads corresponding with the number of I/O contact pads of the IC device is selected 505. Elastomeric interposer fabric dimensioned to the circuit pattern area is applied to the bump pad are of the package substrate 510. The IC device is placed in flip-chip orientation upon the interposer fabric 515. A compressive force is applied on the IC device die 520. The compressive force causes the mutually isolated spherical conductors in the interposer fabric to electrically connect I/O contact pads with corresponding bump pads on the package substrate. An electrical test (E-test) may be perform on the IC device die 525. In the IC device does not pass the test 535, the defective die may be culled out and replaced with another. After the IC device die successfully completes electrical test, the IC device may be locked down onto the interposer substrate 535. The locking down keeps the interposer fabric in a deformed state, maintaining the electrical connection of the mutually isolated spherical conductors between the I/O contacts and corresponding bump pads. Furthermore, after locking down the IC device, the IC device may be encapsulated in a passivating envelope 540 of molding compound.

Locking down may be accomplished, but is not necessarily limited, as discussed supra, by encapsulating the IC device in a passivating envelope having a large TCE mismatch with respect to the package substrate (See FIG. 3). The passivating envelope and package substrate provide opposing forces that serve to keep pressure on the IC device in maintaining the deformation of the interposer fabric. Mechanical clips may be physically attached to the package substrate to provide direct clamping force upon the IC device die. One clip may wrap around the length of the package substrate and provide the clamping force (See FIGS. 4, 5A-5B). Another clip mounted onto the IC device and held down with retention heads may provide the clamping force. This clip (See FIGS. 6A-6B) along with the IC device, interposer fabric, and package substrate is encapsulated in a passivating envelope of molding compound.

With respect to FIG. 4 the pressure force may be derived from a multi-step cure process. First, under low temperature mold, followed by high temperature mold cure. Therefore both a mechanical and material force combination provides the compressive force on the interposer fabric. Over mold is still primarily used for environmental protection. In an example package, the force sufficient to deform the interposer fabric is estimated at about 10 to 40 grams/mm$^2$. The ultimate value is determined by the substrate flatness and may vary for differing package types.

While the present invention has been described with reference to several particular example embodiments, those skilled in the art will recognize that many changes may be made thereto without departing from the spirit and scope of the present invention, which is set forth in the following claims.

The invention claimed is:

1. An integrated circuit device (IC) assembled on a package substrate and encapsulated in a molding compound, the IC device comprising:
   a semiconductor die having topside surface and an underside surface, the topside surface having a circuit pattern, the circuit pattern including contact pads in a predetermined arrangement;
   a package substrate with a length and width, the package substrate having bump pad landings, the pad landings in an arrangement corresponding to the predetermined arrangement of the contact pads of the circuit pattern, the bump pad landings having connection traces coupling the pad landings to external contact regions in the package substrate; and
   an interposer layer sandwiched between the semiconductor die and the package substrate, the interposer layer including randomly distributed mutually isolated conductive columns of spherical particles embedded in an elastomeric material,
   wherein the interposer layer is subjected to a compressive force from pressure exerted upon the underside surface of the semiconductor die, the compressive force deforming the interposer layer causing the conductive columns of spherical particles to electrically connect the contact pads of the circuit pattern with the corresponding bump pad landings of the package substrate;
   wherein the compressive force is obtained from a metal clip in contact with the underside surface of the semiconductor die, and
   the metal clip having a length spanning the length and width of the package substrate and
   having a height less than the combined thickness of the semiconductor die, the interposer fabric, and the package substrate, such that when the metal clip is engaged with the package substrate, the metal clip provides the compressive force.

2. The IC device as recited in claim 1, further including a solder mask layer,
   the solder mask layer having openings corresponding to the arrangement of bump pad landings on the substrate.

3. The IC device as recited in claim 1, wherein the compressive force is obtained from a pre-stress metal clip in contact with underside surface of the semiconductor die,
   the metal clip having a horizontal member and vertical members, the horizontal member substantially covering the underside surface of the semiconductor die, the vertical members anchored with retention heads in through holes defined in the package substrate, the retention heads maintaining the compressive force.

4. The IC device as recited in claim 3, wherein the metal clip has at least two vertical members.

5. The IC device as recited in claim 4, wherein the metal clip has four vertical members.

6. An integrated circuit device (IC) assembled on a package substrate, the IC device comprising:
   a semiconductor die having topside surface and an underside surface, the topside surface having a circuit pattern, the circuit pattern including contact pads in a predetermined arrangement;
   a package substrate having length and width, the package substrate having bump pad landings, the pad landings in an arrangement corresponding to the predetermined arrangement of the contact pads of the circuit pattern, the bump pad landings having connection traces coupling the pad landings to external contact regions in the package substrate; and
   an interposer layer sandwiched between the semiconductor die and the package substrate, the interposer layer including randomly distributed mutually isolated conductive columns of spherical particles embedded in an elastomeric material,
   wherein the interposer layer is subjected to a compressive force from a metal clip exerting pressure upon the underside surface of the semiconductor die, the compressive force deforming the interposer layer causing the conductive columns of spherical particles to electrically connect the contact pads of the circuit pattern with the corresponding bump pad landings of the package substrate; and
   a passivating envelope of molding compound encapsulating the semiconductor die and interposer fabric.

7. The IC device as recited in claim 6, the metal clip is selected from the following,
   an external metal clip having length and width comparable to the length and width of the package substrate, a height slightly less than the combined thickness of the passivating envelope, the semiconductor die, the interposer fabric, and the package substrate, such that when the metal clip is engaged with the package substrate, the metal clip provides the compressive force, the metal clip mounted external to the passivating envelope;
   an internal metal clip in contact with underside surface of the semiconductor die, the metal clip having a horizontal member and two or more vertical members, the horizontal member substantially covering the underside surface of the semiconductor die, the vertical members anchored with retention heads in through-holes defined in the package substrate, the retention heads maintaining the compressive force, the internal metal clip encapsulated within the passivating envelope along with the semiconductor die and interposer fabric on the package substrate.

8. A method for packaging an IC device having a circuit pattern including I/O contact pads in a flip-chip orientation on a package substrate, the package substrate having pad landings corresponding to the I/O contact pads of the circuit pattern, the method comprising:
   a) selecting the package substrate suitable for an I/O pad layout of the IC device;
   b) applying an interposer fabric on the package substrate, the interposer fabric having randomly distributed mutually isolated conductive columns of spherical particles embedded in an elastomeric material;
   c) placing the IC device in the flip-chip orientation upon the interposer fabric;
   d) applying a compressive force on the IC device, the compressive force deforming the interposer layer causing the conductive columns of spherical particles to electrically connect the contact pads of the circuit pattern with the corresponding bump pad landings of the package substrate;
   e) maintaining the compressive force on the IC device; and
   f) encapsulating the IC device in a passivating envelope; and
   wherein maintaining the compressive force on the IC device further includes, using a mechanical clamp.

9. The method as recited in claim 8, further comprising,
   d1) performing an electrical test and making a determination of whether the device passes or fails;
   if fail, obtain another IC device, and perform steps c) and d),
   if pass, go to step e) followed by step f).

* * * * *